United States Patent [19]

Park et al.

[11] Patent Number: 5,060,197

[45] Date of Patent: Oct. 22, 1991

[54] STATIC RANDOM ACCESS MEMORY WITH REDUNDANCY

[75] Inventors: Heui-Chul Park; Chang-Rae Kim, both of Seoul, Rep. of Korea

[73] Assignee: SamSung Electronics Co., Ltd, Kyung, Rep. of Korea

[21] Appl. No.: 486,400

[22] Filed: Feb. 28, 1990

[30] Foreign Application Priority Data

Dec. 30, 1989 [KR] Rep. of Korea ............... 1989-20608

[51] Int. Cl.$^5$ ............................................. G11C 7/00
[52] U.S. Cl. .................................. 365/200; 371/10.2
[58] Field of Search .................... 365/200, 230.03; 371/10.2, 10.3

[56] References Cited

U.S. PATENT DOCUMENTS 4,829,480  5/1989  Seo ........................................ 365/200
4,918,662  4/1990  Kondo .................................... 365/200

Primary Examiner—Joseph A. Popek
Attorney, Agent, or Firm—Robert E. Bushnell, Esq.

[57] ABSTRACT

A semiconductor memory device has normal memory blocks and redundant memory blocks for storing data therein. To elevate the redundancy efficiency, the memory device includes a number of normal block selectors for selecting the normal blocks, a number of redundant decoders for sensing a redundant mode on a basis of address signals provided thereto from an address buffer, a block selection decoder for generating a block selection signal by receiving an external address signal shaped, and a redundancy combining signal generator for generating a normal block selection signal and a redundant block selection signal by receiving output of the block selection decoder and output of the redundant decoder.

21 Claims, 6 Drawing Sheets

STATIC RANDOM ACCESS MEMORY WITH REDUNDANCY

FIELD OF THE INVENTION

The present invention generally relates to a semiconductor memory device having redundancy thereon. In particular, the present invention relates to a static random access memory (SRAM) with redundancy having divided word lines (DWL).

In recent, it is commonly admitted to apply a semiconductor memory with redundancy having spare cells thereon for substituting defective memory cells in a semiconductor memory device. However, with a rapid advancement in memory density, it is necessary to allot more space for the spare cell array (or redundancy cell array) in a semiconductor memory device, which, of course, causes a semiconductor chip to increase its size. Further, there arises a demand for obtaining more efficient redundant operation conforming to the advancement of the density.

Referring to FIG. 1, a prior art SRAM with redundancy is shown schematically. As illustrated, a memory cell array 10 is operatively arranged including normal cell blocks $NB_1$-$NB_k$, redundant blocks $RB_1$-$RB_k$ and block selectors $BS_1$-$BS_k$. On the right-hand side of the memory cell array 10, an address buffer 20 for receiving external address signal $XA_0$-$XA_7$ and a row decoder 30 for decoding the received external address signal are arranged. A block selection decoder 60 is arranged at the left-hand side of the memory cell array 10. Meanwhile, a column decoder 50 and a redundancy decoder 40 are respectively arranged at the upper and lower side of the memory cell array 10.

In the SRAM of FIG. 1, the redundant cells (or spare cells) located in the same row, within the redundant blocks $RB_1$-$RB_k$, are coupled to the same word line, and the lines $MWL_1$-$MWL_m$ of the row decoder 30 are main word lines for selecting any one row out of m number of the memory cell rows, in response to the external address signals $XA_0$-$XA_k$. The main word lines $MWL_1$-$MWL_m$, as best illustrated in FIG. 2 which shows a partially detailed circuit diagram of FIG. 1, select respectively only a block word line from the block word lines $BWL_{11}$-$BWL_{km}$, which is chosen by being logically processed together with the block selection signals $BSWL_1$-$BSWL_k$ inversely received from the block selection decoder 60. The above-mentioned technology for selection of word lines is called divided-word-line (DWL) technique which is well disclosed in IEEE Journal of Solid-State Circuits, VOL. SC-22, NO.5, October 1987.

According to the prior art redundancy implementation in connection to FIG. 1 and FIG. 2, when one of the normal cells which are under the control of the main word lines $MWL_1$-$MWL_m$ is defective, every normal cell included in the row address corresponding to the defective cell is substituted (that is, replaced) by the redundant cells (or spare cells). For example, when a normal cell coupled to a first block word line $BWL_{21}$ of a normal block $NB_2$ is defective, the normal cells connected to the block word lines $BWL_{11}$, $BWL_{21}$ . . . $BWL_{k1}$ which correspond to the row of the block word line $BWL_{21}$ are all replaced by the redundancy cells (or spare cells) coupled to a word line in the redundant blocks $RB_1$-$RB_k$.

Therefore, since every normal cell of a corresponding row is substituted in order to substitute a defective normal cell, in the prior semiconductor memory with redundancy, there is a problem of low redundancy efficiency. In other words, only one defective normal cell may be repaired with all of the redundancy memory cells (generally, 256 cells) of a row, thereby wasting the chip-area.

SUMMARY OF THE INVENTION

An object of the invention is therefore to provide a memory with redundancy, capable of elevating the redundancy efficiency, for use in a static random access memory.

According to an aspect of the invention to obtain the nature and object of the invention, a semiconductor memory device having redundant blocks and normal blocks includes a plurality of block selectors for selecting the normal blocks; a plurality of redundant decoders for sensing a redundant mode when receiving an address signal of a row address including a defective normal cell, by analyzing an external address signal which is shaped and predecoded; a block selection decoder for producing the block selection signals by receiving the shaped external address signals; and a redundancy combining circuit having a plurality of logic gates for producing the redundant block selection signals by receiving inverted output of the redundant decoder, and for selecting the normal blocks of the block selectors by receiving output of the redundant decoders, whereby the memory device substitutes the redundant blocks for a defective normal cell.

These and other objects, features, and advantages of the semiconductor memory device with redundancy of the present invention will become apparent from the following detailed description of the specifically preferred embodiment taken in conjunction with the accompanying drawings, through which like reference numerals and symbols designate like elements and parts.

BRIEF DESCRIPTION OF THE DRAWINGS

For a better understanding of the invention and to show how the same maybe carried into effect, reference will now be made, by way of example, to the accompanying diagrammatic drawings, in which.

DETAILED DESCRIPTION OF THE PREFERRED EMBODIMENTS

An embodiment of a semiconductor static random access memory with redundancy according to the present invention will now be described hereinbelow in detail with reference to the attached drawings, by way of example.

Figure 1:
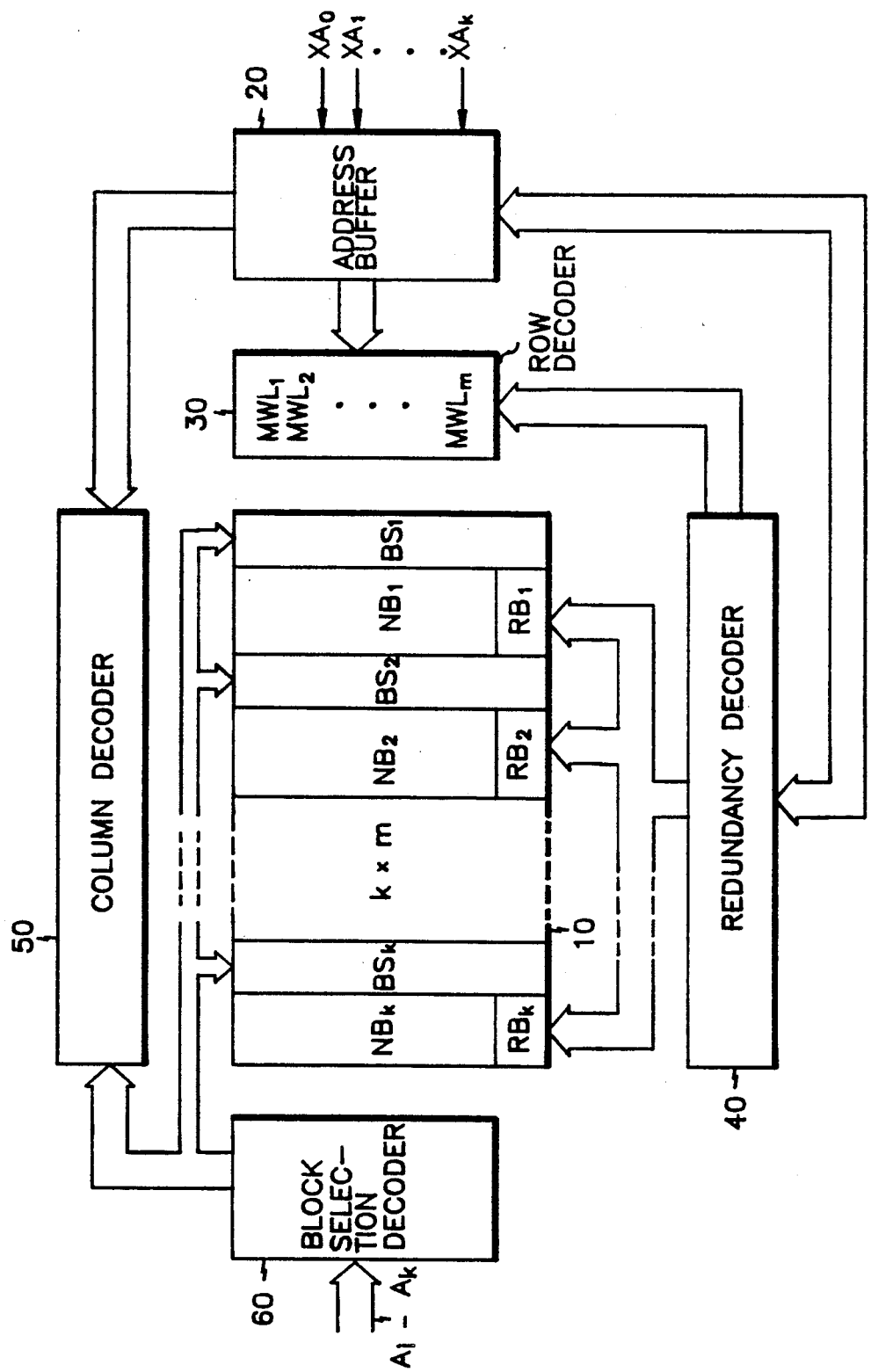
FIG. 1 shows a prior art static random access memory (SRAM) with redundancy.
Figure 2:
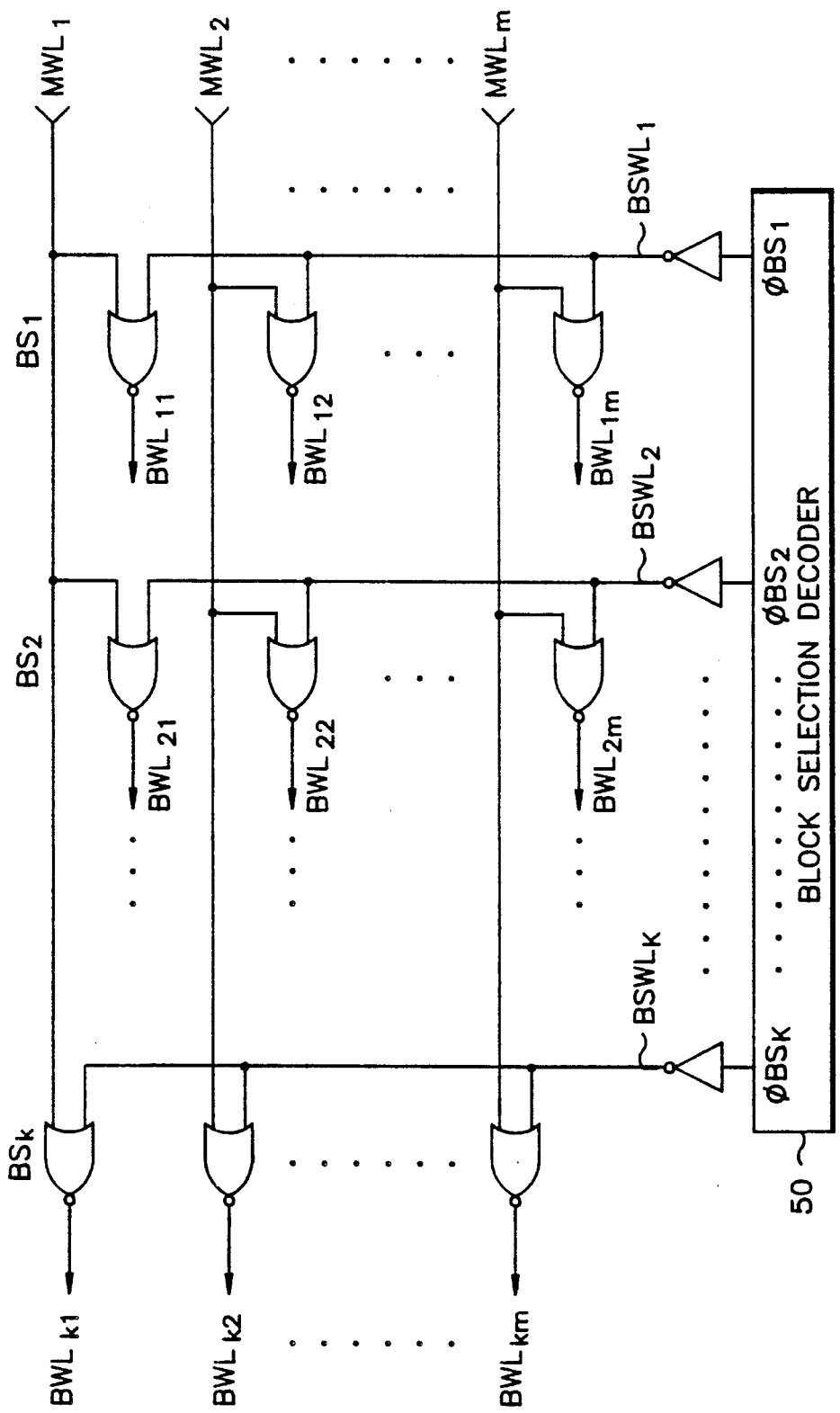
FIG. 2 is a circuit for partially illustrating the SRAM of FIG. 1 in detail.
Figure 3:
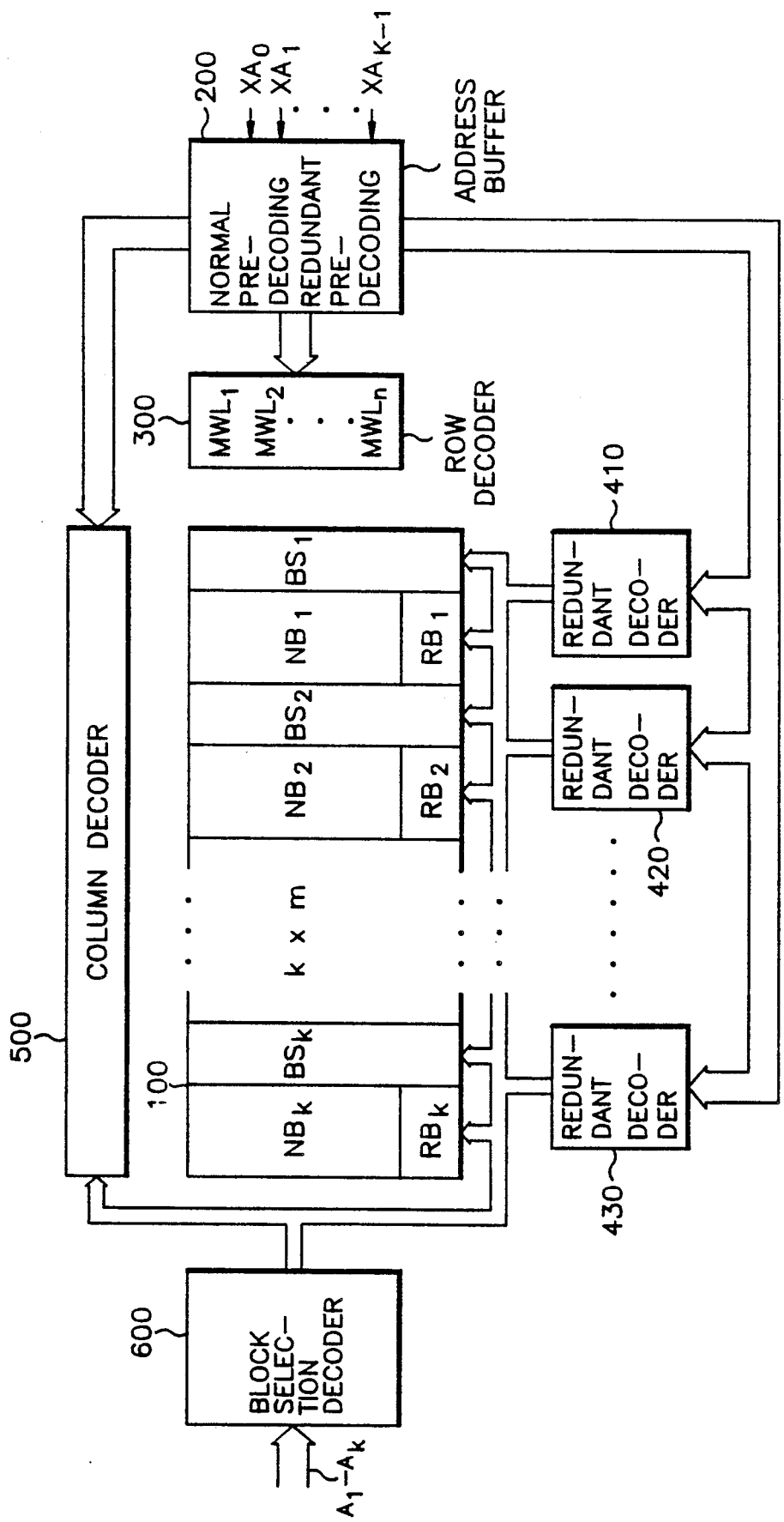
FIG. 3 shows an SRAM with redundancy thereon, embodied according to the present invention.

Referring primarily to FIG. 3, an SRAM, as best illustrated in the drawing, includes normal cell blocks $NB_1$-$NB_k$, redundant cell blocks $RB_1$-$RB_k$, an address buffer 200 for pre-decoding an external address signal so as to control block selectors $BS_1$-$BS_k$ placed between the above normal cell blocks $NB_1$-$NB_k$ and redundant cell blocks $RB_1$-$RB_k$, a row decoder 300 for selecting main word lines $MWL_1$-$MWL_m$ in response to the output of the address buffer 200, a column decoder 500 for decoding column address signals, a block selection decoder 600 for receiving output of the address buffer 200, and redundant decoders 410, 420, 430.

Figure 5:
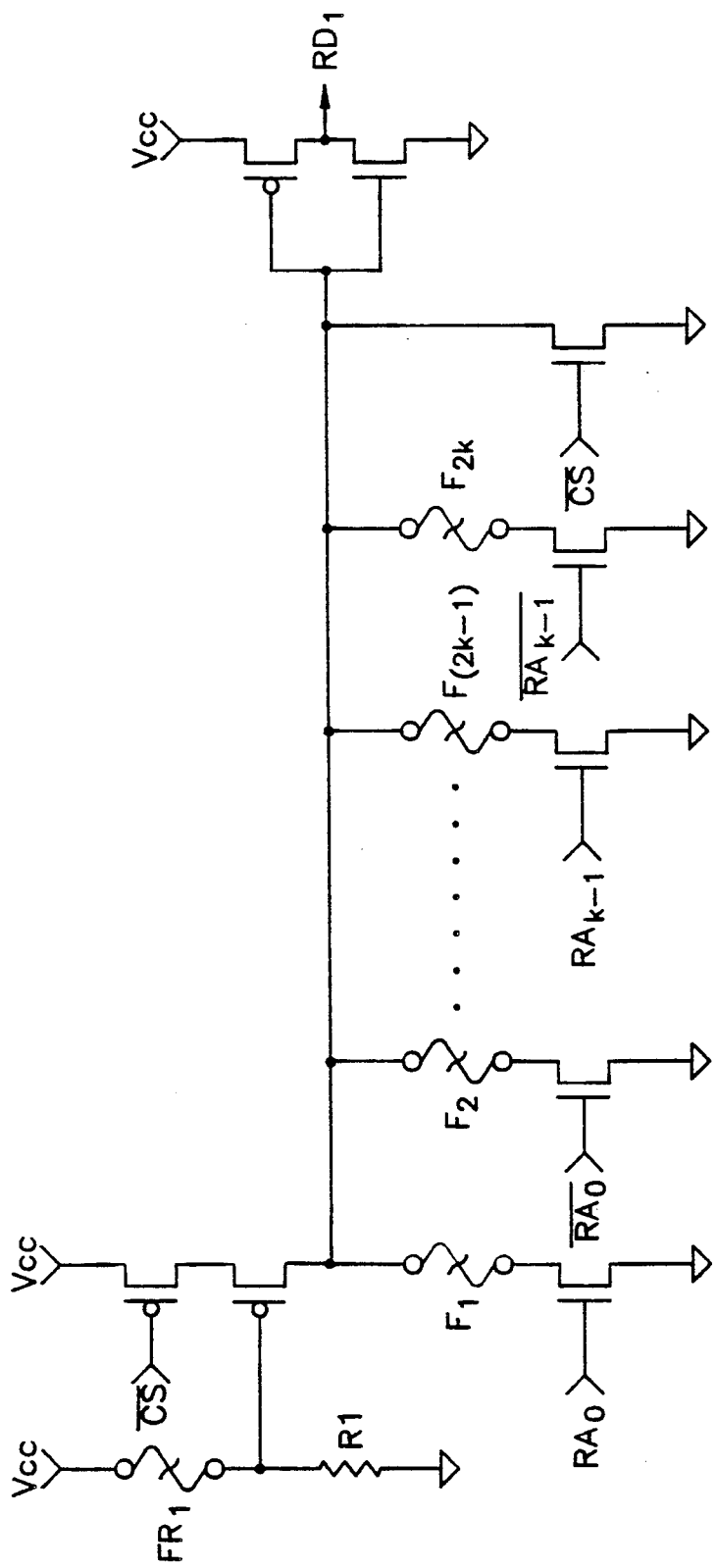
FIG. 5 is a detailed diagram of a redundancy decoder embodied according to the present invention.

The redundant decoders 410-430, as best illustrated in detail in FIG. 5, produce redundant output $RD_i$ (i=1 to k) through the output terminal thereof, by use of a fuse programming circuit including a fuse $RF_1$ and a resistor $R_1$. A plurality of n-type IGFET's (Insulated Gate Field Effect Transistor) in the redundant decoders 410-430 receive fuse-programming signals through a plurality of fuses $F_1$-$F_{2k}$ at their drains, respectively, and receive the pre-decoded output $RA_o/\overline{RA_o}$ ... $RA_{k-1}$ from the address buffer 200, thereby performing logic NAND operations to provide the output $RD_i$ at the output thereof.

Figure 6:
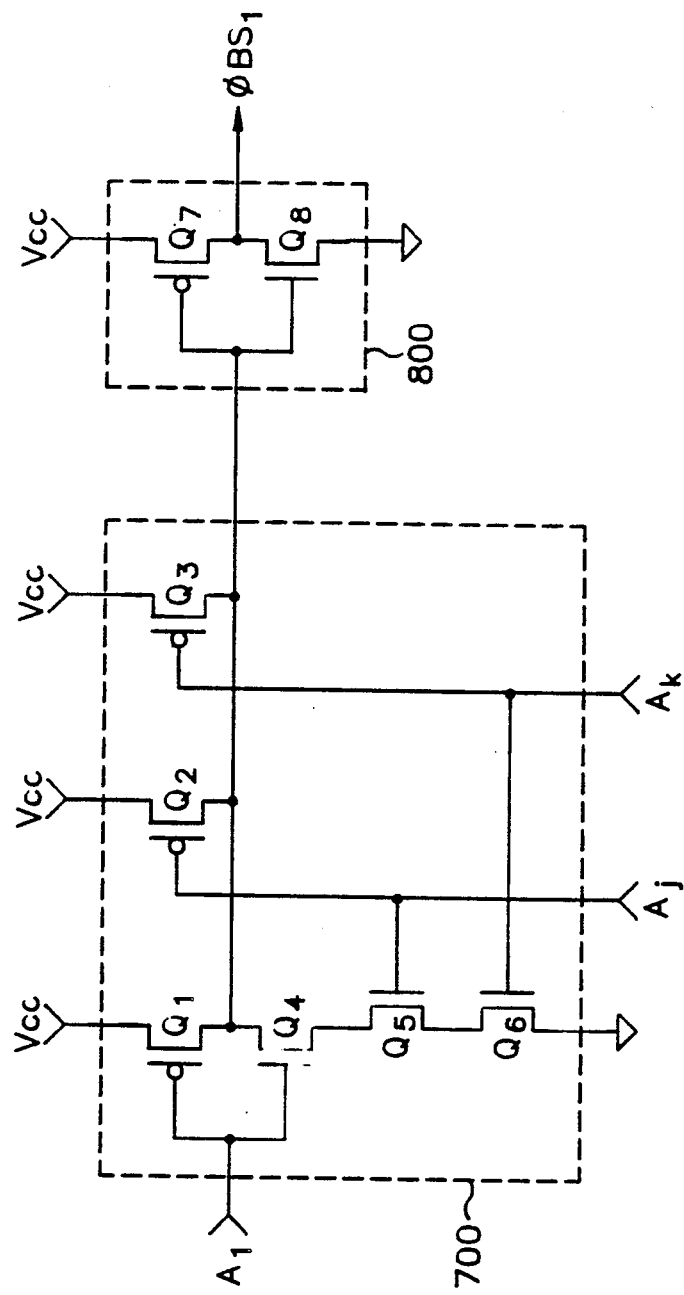
FIG. 6 is another detailed diagram of block selection decoder embodied according to the present invention.

The block selection decoder 600, as best illustrated in detail in FIG. 6, produces block selection signal $\phi BS_i$ (i=1 to k) by way of an inverter 800, by receiving output $A_i$, $A_j$, $A_k$ of the address buffer 200 as triple-input of a NAND gate 700.

Figure 4:
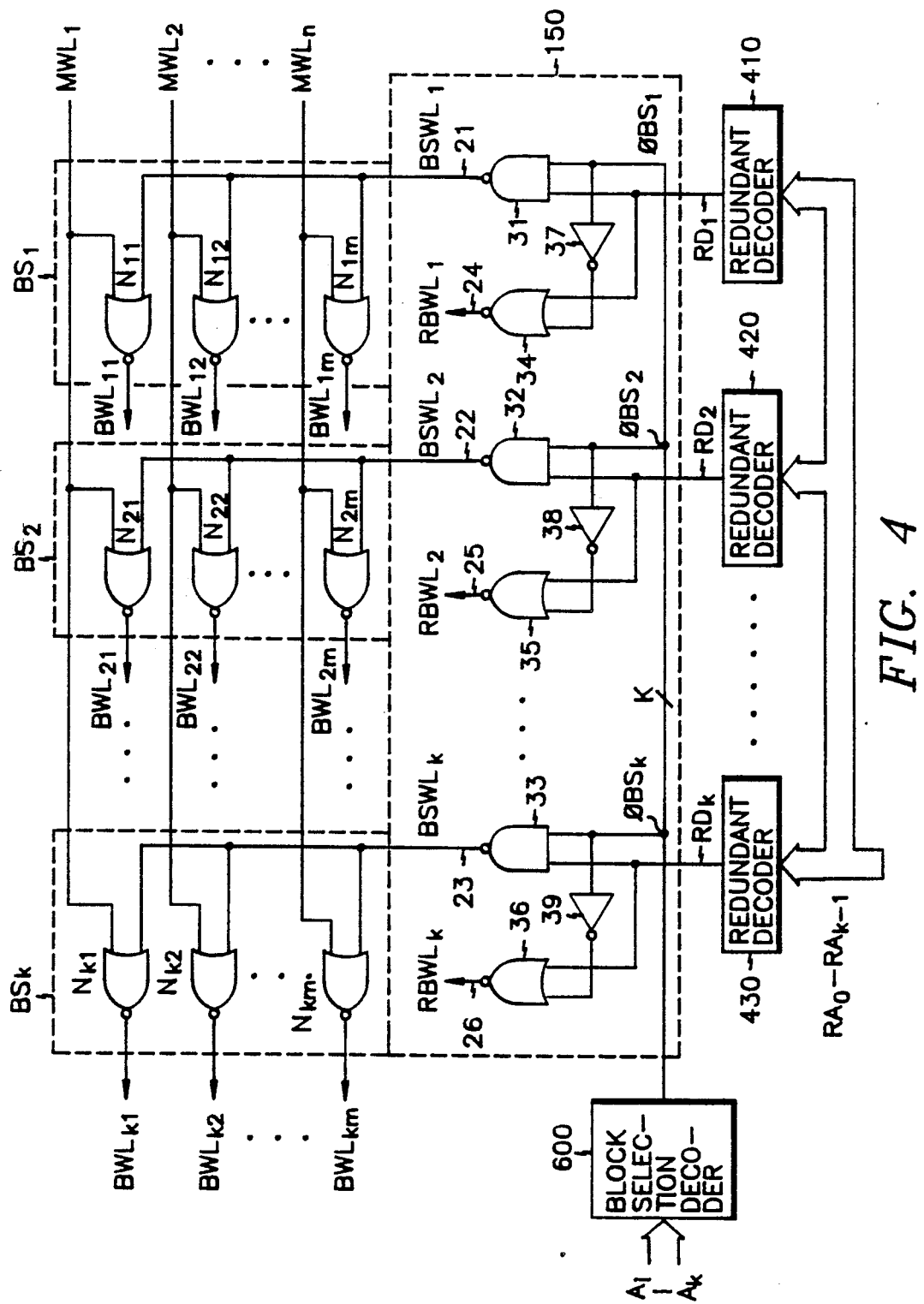
FIG. 4 is a diagram for partially illustrating the SRAM of a FIG. 3 in detail.

Referring to FIG. 4, it shows redundancy operation, in which a detailed internal circuit diagram of the block selector $BS_1$-$BS_k$ roughly shown in FIG. 3 is illustrated. In addition, the redundant decoders 410-430 and the block selection decoder 600 are presented. There is also shown the redundancy combining circuit 150 for selecting the normal block word lines $BWL_{11}$-$BWL_{km}$ and the redundant block word lines $RBWL_1$-$RBWL_k$, by combining the output of the redundant decoders 410-430 and the block selection decoder 600. The redundancy combining circuit 150 includes a plurality of NAND gates 31-33 and a plurality of NOR gates 34-36. The NAND gates 31-33 produce the normal block selection signal $BSWL_1$, $BSWL_2$, ... $BSWL_k$, by receiving the output $RD_1$, $RD_2$, ... $RD_k$ of the redundant decoder 410-430 and by receiving the output $\phi BS_1$, $\phi BS_2$, ... $\phi BS_k$ of the block selection decoder 600. The NOR gates 34-36 produce the redundant block selection signals $RBWL_1$, $RBWL_2$, ... $RBWL_k$, by receiving the output $RD_1$, $RD_2$, ... $RD_k$ of the redundant decoder 410-430 and by receiving the output $\phi BS_1$, $\phi BS_2$, ... $\phi BS_k$ which is inverted by inverters 37-39.

Operation of the semiconductor memory device with redundancy according to the present invention will now be described in more detail with reference to FIGS. 3 through 6. First of all, the external address signals $XA_0$, $XA_1$, ... $XA_{k-1}$ provided to the address buffer 200 are buffered and then respectively pre-decoded for the normal blocks and the redundant blocks. Then, the signal pre-decoded for the normal blocks are provided to the row decoder 300 so as to select any one of the main word lines $MWL_1$-$MWL_m$. In the meantime, the signals $RA_0$-$RA_{k-1}$ pre-decoded for the redundant blocks are provided to the NAND gates of the n-type IGFET's of the redundant decoders 410-430 shown in FIG. 5.

If there is no need to substitute a redundant cell for a defective normal cell because none of the normal cells are defective, the output $RD_i$ of the redundant decoders 410-430 sustains the logic "high" state. Thus, the normal block selection signal $BSWL_i$ (i=1 to k) of a selected normal block goes to the logic "low" state in response to the logic state of the block selection decoder 600. The logic state of the normal block selection signals $BSWL_i$ are provided to an input of the NOR gates $N_{11}$, $N_{21}$, ... $N_{km}$ together with the main word line signals $MWL_1$-$MWL_m$ which are provided to another input of the NOR gates $N_{11}$-$N_{km}$. The NOR gates $N_{11}$-$N_{km}$ then produce correspondingly the normal block word line signals $BWL_{11}$-$BWL_{km}$ so as to enable the corresponding normal block word line.

On the other hand, the output signals $\phi BS_1$-$\phi BS_k$ of the block selection decoder 600 are logically processed, after inverted, by the NOR gates 34-36 of the redundancy combining circuit 150, together with the output $RD_1$-$RD_k$ of the redundant decoders 410-430. If the semiconductor memory device is not in a redundancy mode, a redundant block selection signal $RBWL_1$-$RBWL_k$ is in a disable state. However, if the semiconductor memory device is in redundancy mode, a redundant block selection signal $RBWL_1$-$RBWL_k$ is in an enable state. Accordingly, a defective normal block selected by the enabled redundant block selection signal $RBWL_1$-$RBWL_k$ is replaced by a redundant block located at a corresponding row and column.

As described above, the SRAM with redundancy according to the present invention may substitute a redundant block for a corresponding defective normal block which is divided into cell units or into a given group, by combining the output of the block selection decoder and the redundant decoder. Moreover, when the redundant decoder is formed at an unused area (periphery) of a semiconductor chip, the efficiency of the chip area, according to high density of the chip, and redundancy efficiency may be maximized.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A semiconductor memory device having at least one normal block and at least one redundant block, comprising:
   a plurality of normal block selectors for selecting corresponding ones of a plurality of normal blocks;
   a plurality of redundant decoders for sensing a redundant mode on a basis of address signals provided thereto from an address buffer;
   a block selection decoder for generating a block selection signal in response to reception of an external address signal; and
   redundancy combining means for generating a normal block selection signal and a redundant block selection signal, in dependence upon output of said block selection decoder and output of said redundant decoder;
   wherein several of said plurality of redundant decoders each comprise:
      fuse programming means for generating a fuse programming signal for replacing a defective one of said normal blocks with a redundant block;
      first logic means for performing logical NAND operations on a basis of said fuse programming signal and a pre-decoded redundant signal received from the address buffer; and
      first inverting means for inverting the output generated from said first logic means and for providing said inverted output signal to said redundancy combining means.

2. A semiconductor memory device of claim 1, wherein said respective normal block selector designates a corresponding normal block, on a basis of address signals from a main word line and said normal block selection signal from said redundancy combining means.

3. A semiconductor memory device of claim 2, wherein said normal block selector comprises a plurality of NOR gates, a first input terminal of said respective NOR gates each receiving the address signal from the main word line, a second input terminal of said respective NOR gates each receiving said normal block selection signal.

4. A semiconductor memory device of claim 1, wherein said fuse programming means comprises two of the same type of transistors so as to generate the fuse programming signal, a gate formed at one of said two transistors being coupled between a programming fuse and a programming resistor.

5. A semiconductor memory device of claim 1, wherein said first inverting means comprises two different types of transistors connected in series so as to invert the output of said first logic means, respective gates of said two transistors being commonly coupled to the output of said first logic means.

6. A semiconductor memory device of claim 1, wherein said block selection decoder comprises:
second logic means for performing logical NAND operations by receiving said external address signal; and
second inverting means for inverting output generated from said second logic means.

7. A semiconductor memory device of claim 1, wherein said redundancy combining means comprises:
means for generating said normal block selection signal by receiving the output of said redundant decoder and the block selection signal generated from said block selection decoder; and
means for generating said redundant block selection signal by receiving the output of said redundant decoder and an inverted signal of the block selection signal generated from said block selection decoder.

8. A semiconductor memory device of claim 7, wherein said memory device comprises a plurality of individual redundant decoders coupled to each said normal block and each said redundant block, whereby only one defective normal block address is detected.

9. A semiconductor memory device of claim 7, wherein said memory device comprises a plurality of individual redundant decoders coupled to every two or more normal blocks and redundant blocks, whereby two or more defective normal blocks are replaced by said two or more redundant blocks when a defective normal address is detected.

10. A semiconductor memory device, comprising:
a plurality of normal block selector means for selecting corresponding ones of a plurality of normal blocks;
a plurality of redundant decoding means for sensing a redundant mode on a basis of address signals provided from an address buffer;
block selection decoding means for generating a block selection signal in response to an external address signal; and
combining means for generating a normal block selection signal and a redundant block selection signal, said redundancy combining means comprising:
means for generating said normal block selection signal in dependence upon the output of said redundant decoder and the block selection signal generated from said block selection decoder; and
means for generating said redundant block selection signal in dependence upon the output of said redundant decoder and an inverted signal of the block selection signal generated from said block selection decoder.

11. A semiconductor memory device of claim 10, wherein said memory device comprises a plurality of individual redundant decoders coupled to each said normal block and each said redundant block, whereby only one defective normal block address is detected.

12. A semiconductor memory device of claim 10, wherein said memory device comprises a plurality of individual redundant decoders coupled to every two or more normal blocks and redundant blocks, whereby two or more defective normal blocks are replaced by said two or more redundant blocks when a defective normal address is detected.

13. A semiconductor memory device having a normal block and a redundant block, comprising:
predecoding means for responding to external address signals by providing word line selection signals, local address signals, and redundant selection signals;
first decoder means for responding to local address signals by providing normal block signals;
second decoder means for responding to said redundant selection signals by providing redundant block signals unique to corresponding ones of a plurality of redundant blocks;
combining means coupled for responding to said normal block signals and said redundant block signals, by providing either normal block selection signals or redundant block selection signals, in dependence upon logic states of said redundant block signals; and
means for selecting word lines in a plurality of normal blocks of the memory device in dependence upon said word line selection signals and said normal block selection signals.

14. The semiconductor memory device of claim 13, wherein said second decoding means comprises:
a plurality of first means for applying said redundant block signals to said combining means in response to corresponding intermediate selection signals;
a plurality of second means for enabling application of said intermediate selection signals to corresponding ones of said first means in response to said redundant selection signals; and
means for controlling said application of said intermediate selection signals.

15. The semiconductor memory device of claim 13, wherein said second decoding means comprises:
a plurality of first means not less in number than the number of said second decoding means, for applying said redundant block signals to said combining means in response to corresponding intermediate selection signals;
a plurality of second means not less in number than the number of said word lines selecting means, for enabling application of said intermediate selection signals to corresponding ones of said first means in response to said redundant selection signals; and means for controlling said application of said intermediate selection signals.

16. A semiconductor memory device, comprising:

predecoding means for responding to external address signals by providing word line selection signals, local address signals and redundant selection signals;

first decoder means for responding to local address signals by providing normal block signals;

a plurality of first means for providing redundant block signals in response to corresponding intermediate selection signals;

a plurality of second means for enabling application of said intermediate selection signals to corresponding ones of said first means in response to said redundant selection signals;

means for controlling said application of said intermediate selection signals to said plurality of second means;

combining means coupled for responding to said normal block signals and said redundant block signals, by providing either normal block selection signals or redundant block selection signals; and means for selecting word lines in a plurality of normal blocks of the memory device in dependence upon said word line selection signals and said normal block selection signals.

17. The semiconductor memory device of claim 16, wherein said selecting means comprises a plurality of block selectors, said memory device further comprising a plurality of normal blocks of memory cells, with word lines of each of said normal blocks being coupled to be selected by corresponding ones of said block selectors.

18. The semiconductor memory device of claim 16, wherein:

said combining means comprises a plurality of stages, with each of said stages being coupled to receive said normal block signals and a corresponding one of said redundant block signals; and each of said plurality of first means being coupled to provide said redundant block signals to corresponding ones of said stages.

19. The semiconductor memory device of claim 18, further comprised of said controlling means being connectable to enable selected ones of said second means to allow said application of said intermediate signals to said corresponding ones of said first means in response to corresponding ones of said redundant selection signals.

20. A semiconductor memory device of claim 18, wherein:

each of said plurality of second means comprises a plurality of branches each connectable to apply ones of said intermediate selection signals to a corresponding one of said first means in response to a corresponding one of said redundant selection signal; and said controlling means is connectable to prevent selected ones of said plurality of branches from applying said intermediate selection signals to corresponding ones of said first means.

21. The semiconductor memory device of claim 18, wherein;

each of said plurality of second means comprises a plurality of branches each connectable to apply ones of said intermediate selection signals to a corresponding one of said first means in response to a corresponding one of said redundant selection signal;

said controlling means is connectable to control said application of said intermediate signals to corresponding ones of said first means via said plurality of branches.

* * * * *

UNITED STATES PATENT AND TRADEMARK OFFICE
CERTIFICATE OF CORRECTION

PATENT NO. : 5,060,197
DATED : 22 October 1991
INVENTOR(S) : Heui-Chul PARK et al.

It is certified that error appears in the above-identified patent and that said Letters Patent is hereby corrected as shown below:

Column 2, Line 55, insert --a-- after "of";

Column 3, Line 12, change "$RF_1$" to --$FR_1$--;

Column 4, Line 11, insert --being-- before "inverted".

Column 2, line 52, "a" should be deleted.

Signed and Sealed this

Ninth Day of March, 1993

*Attest:*

STEPHEN G. KUNIN

*Attesting Officer*            *Acting Commissioner of Patents and Trademarks*